(12) United States Patent
Li

(10) Patent No.: US 10,886,485 B2
(45) Date of Patent: Jan. 5, 2021

(54) QUANTUM DOT LIGHT EMITTING DIODE (QLED) AND MANUFACTURE METHOD THEREOF, DISPLAY PANEL

(71) Applicant: BOE TECHNOLOGY GROUP CO., LTD., Beijing (CN)

(72) Inventor: Dong Li, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/144,308

(22) Filed: Sep. 27, 2018

(65) Prior Publication Data
US 2019/0273214 A1 Sep. 5, 2019

(30) Foreign Application Priority Data
Mar. 1, 2018 (CN) .......................... 2018 1 0171033

(51) Int. Cl.
*H01L 51/50* (2006.01)
*H01L 27/32* (2006.01)
(Continued)

(52) U.S. Cl.
CPC ............ *H01L 51/502* (2013.01); *H01L 27/32* (2013.01); *H01L 51/5064* (2013.01);
(Continued)

(58) Field of Classification Search
CPC ... H01L 51/502; H01L 27/32; H01L 51/5064; H01L 51/5072; H01L 51/5088; H01L 51/5203; H01L 51/56; H01L 51/5056; H01L 33/005; H01L 33/06; H01L 2251/303
See application file for complete search history.

(56) References Cited

U.S. PATENT DOCUMENTS 9,349,971 B2 5/2016 Snaith
9,887,326 B2 2/2018 Wang et al.
(Continued)

FOREIGN PATENT DOCUMENTS

CN 102625956 A 8/2012
CN 105609535 A 5/2016
(Continued)

OTHER PUBLICATIONS

Third Chinese Office Action from Chinese Patent Application No. 201810171033.0 dated Apr. 13, 2020 from the Chinese Patent Office.
(Continued)

*Primary Examiner* — Su C Kim
(74) *Attorney, Agent, or Firm* — Dilworth & Barrese, LLP.; Michael J. Musella, Esq.

(57) ABSTRACT

A quantum dot light emitting diode (QLED) and a manufacture method thereof, a display panel are provided. The QLED includes a hole transport layer and a quantum dot light emitting layer, the hole transport layer includes a porous structure layer having pores, the quantum dot light emitting layer is disposed on the hole transport layer; the quantum dot light emitting layer contacts the porous structure layer, and a material of the quantum dot light emitting layer is disposed in at least a part of the pores.

14 Claims, 4 Drawing Sheets

(51) Int. Cl.
*H01L 51/52* (2006.01)
*H01L 51/56* (2006.01)

(52) U.S. Cl.
CPC ...... *H01L 51/5072* (2013.01); *H01L 51/5088* (2013.01); *H01L 51/5203* (2013.01); *H01L 51/56* (2013.01)

(56) References Cited

U.S. PATENT DOCUMENTS

| | | | |
|---|---|---|---|
| 10,295,872 B2 | 5/2019 | Jiang et al. | |
| 2008/0001538 A1* | 1/2008 | Cok | B82Y 20/00 313/506 |
| 2008/0237612 A1* | 10/2008 | Cok | H01L 51/5012 257/88 |
| 2009/0266418 A1 | 10/2009 | Hu et al. | |
| 2016/0027966 A1* | 1/2016 | Dubrow | H01L 33/06 257/13 |
| 2016/0118627 A1 | 4/2016 | Rand et al. | |
| 2017/0045680 A1 | 2/2017 | Chou et al. | |
| 2018/0138434 A1* | 5/2018 | Yoon | H01L 51/502 |
| 2018/0312959 A1* | 11/2018 | Brown | H01J 37/3491 |

FOREIGN PATENT DOCUMENTS

| | | |
|---|---|---|
| CN | 105733556 A | 7/2016 |
| CN | 105977393 A | 9/2016 |
| CN | 106684246 A | 5/2017 |
| CN | 108054294 A | 5/2018 |
| WO | 2009142787 A2 | 11/2009 |

OTHER PUBLICATIONS

Jiahui Li etc., All-Inorganic Quantum-dot Light-emitting-diodes with Vertical Nickel Oxide; Progress in Natural Science: Materials International, Paragraphs[503]-[508], Sep. 22, 2016.

* cited by examiner

QUANTUM DOT LIGHT EMITTING DIODE (QLED) AND MANUFACTURE METHOD THEREOF, DISPLAY PANEL

CROSS REFERENCE TO RELATED APPLICATION

The present application claims priority to the Chinese patent application No. 201810171033.0, filed on Mar. 1, 2018, the entire disclosure of which is incorporated herein by reference as part of the present application.

TECHNICAL FIELD

Embodiments of the present disclosure relate to a quantum dot light emitting diode (QLED) and a manufacture method thereof, a display panel.

BACKGROUND

A quantum dot (QD) is a kind of nanoscale semiconductor. Where the nanoscale semiconductor is applied with a certain electric field or light pressure, the nanoscale semiconductor can emit light of a specific frequency. The quantum dot can be used as a light emitting material, which has advantages of high color purity, high luminescence quantum efficiency, adjustable luminescence color and long service life, and becomes a research hotspot of new LED light emitting materials. Therefore, the quantum dot light emitting diode (QLED) using quantum dot materials as the light emitting layer has become a main research direction of new display devices.

SUMMARY

At least one embodiment of the present disclosure provides a quantum dot light emitting diode (QLED), which comprises a hole transport layer and a quantum dot light emitting layer, the hole transport layer comprises a porous structure layer having pores, the quantum dot light emitting layer is disposed on the hole transport layer, the quantum dot light emitting layer contacts the porous structure layer, and a material of the quantum dot light emitting layer is disposed in at least a part of the pores.

At least one embodiment of the present disclosure provides a display panel, comprising any one of the above quantum dot light emitting diodes.

At least one embodiment of the present disclosure provides a manufacture method of a quantum dot light emitting diode (QLED), comprising: forming a hole transport layer, wherein the hole transport layer comprises a porous structure layer having pores; and forming a quantum dot light emitting layer on the hole transport layer, the quantum dot light emitting layer is formed to contact the porous structure layer, and a material of the quantum dot light emitting layer is formed in at least a part of the pores.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
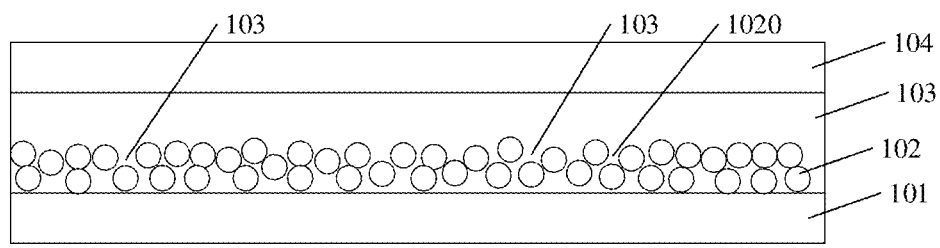
FIG. 1 is a first schematic diagram of a quantum dot light emitting diode provided by an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Inventors of the present disclosure find in research that in a current quantum dot light emitting diode device, materials of a hole injection layer and a hole transport layer are usually organic materials such as organic polymers PEDOT, TFB, poly-TPD and so on. However, these organic materials usually contain acidic components, which have potential destructive effects on functional components, such as transparent electrodes, in the quantum dot light emitting diode structure. In addition, the hole injection layer and the hole transport layer formed by the organic materials are sensitive to water and oxygen, and in the process of forming the hole injection layer and the hole transport layer by a solution method, the solvent in the organic solution cannot be ensured to be removed completely, and the uniformity of the formed film cannot be ensured as well, and therefore the efficiency and lifetime of the finally formed quantum dot light emitting diode device are affected. In addition, because of the energy level position, etc., the electron injection capability of quantum dot materials (such as red and green quantum dot materials) is generally superior to a hole injection capability, so the number of electrons is greater in the whole carriers, resulting in the distribution of carriers in the device being unbalanced, which limits further improvement of the efficiency and stability of the quantum dot light emitting diode device.

At least one embodiment of the present disclosure provides a quantum dot light emitting diode (QLED), the QLED comprises a hole transport layer and a quantum dot light emitting layer; the hole transport layer comprises a porous structure layer having pores; the quantum dot light emitting layer is disposed on the hole transport layer; the quantum dot light emitting layer contacts the porous structure layer, and a forming material of the quantum dot light emitting layer is disposed in at least a portion of the pores.

At least one embodiment of the present disclosure provides a display panel, comprising the above quantum dot light emitting diode.

At least one embodiment of the present disclosure provides a manufacture method of a quantum dot light emitting diode (QLED), comprising: forming a hole transport layer, wherein the hole transport layer comprises a porous structure layer having pores; and forming a quantum dot light emitting layer on the hole transport layer, wherein the quantum dot light emitting layer is formed to contact the porous structure layer, and a forming material of the quantum dot light emitting layer is formed in at least a portion of the pores.

The quantum dot light emitting diode, and the manufacture method thereof, the display panel provided by the present disclosure are described below by several specific embodiments.

At least one embodiment of the present disclosure provides a quantum dot light emitting diode (QLED), as illustrated in FIG. 1, the QLED comprises a hole transport layer 102 and a quantum dot light emitting layer 103; the hole transport layer 102 comprises a porous structure layer having pores 1020; the quantum dot light emitting layer 103 is disposed on the hole transport layer 102; the quantum dot light emitting layer 103 contacts the porous structure layer, and a forming material of the quantum dot light emitting layer is disposed in at least a portion of the pores.

For example, the forming material of the quantum dot light emitting layer is distributed in all the pores of the porous structure layer.

For example, in the embodiment, the quantum dot light emitting diode may further comprise a first electrode and a second electrode. For example, as illustrated in FIG. 1, the hole transport layer 102 is disposed on the first electrode 101, and the second electrode 104 is disposed on the quantum dot light emitting layer 103.

For example, in the quantum dot light emitting diode illustrated in FIG. 1, circular particles in the hole transport layer 102 represent a material of the hole transport layer 102, all of the circular particles and the pores formed between the circular particles constitute the porous structure layer. In the embodiment, the pores comprised in the hole transport layer may have sizes, for example, ranging from 2 nm to 100 nm, for example, the pores are mesopores having sizes ranging from 2 nm to 50 nm.

For example, the quantum dot light emitting layer 103 contacts the porous structure layer, and the forming material of the quantum dot light emitting layer is disposed in at least a portion of the pores. For example, in a manufacture process of the quantum dot light emitting diode device, under a condition that the quantum dot light emitting layer 103 is formed on the hole transport layer 102, the material of the quantum dot light emitting layer material may be formed in the pores of the hole transport layer 102, and then a dense quantum dot light emitting layer 103 is formed. For example, in the embodiment, there is no clear boundary between the hole transport layer 102 having pores and the quantum dot light emitting layer 103, because the material of the quantum dot light emitting layer 103 is also provided in the pores of the hole transport layer 102.

In the embodiment, the forming material of the quantum dot light emitting layer is disposed in at least a portion of the pores of the hole transport layer, so that the quantum dot light emitting layer sufficiently contacts the hole transport layer, and a contact area of the hole transport layer and the quantum dot light emitting layer is increased. Therefore, an amount of holes injected into the quantum dot light emitting layer can be increased, to allow the number of carriers (for example, electrons and holes) in the quantum dot light emitting layer to be more balanced.

Figure 2:
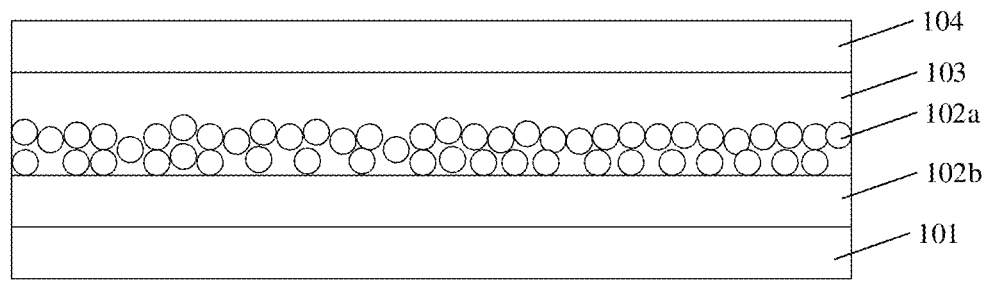
FIG. 2 is a second schematic diagram of a quantum dot light emitting diode provided by an embodiment of the present disclosure.

For example, in the embodiment, as illustrated in FIG. 2, the hole transport layer 102 may comprise an upper hole transport layer 102a and a lower hole transport layer 102b. The upper hole transport layer 102a is the porous structure layer having pores. For example, the lower hole transport layer 102b is a dense hole transport layer. The lower hole transport layer can avoid a current leakage resulting from the quantum dot light emitting layer material directly contacting the first electrode through the pores in the upper hole transport layer to affect the light emitting efficiency of the quantum dot light emitting diode.

For example, in the embodiment, a material of the hole transport layer may be an inorganic material, such as molybdenum oxide, vanadium oxide, tungsten oxide, nickel oxide or the like. The type of the inorganic material may be selected according to an actual situation, for example, the material of the quantum dot emitting layer and so on, which is not limited in the embodiment.

In the embodiment, the hole transport layer formed by the inorganic material has a good water-proof capability and oxygen permeability resistance, and a crystal structure of the inorganic material is stable, and residual impurities may be removed by a high-temperature process, so the hole transport layer formed by the inorganic material can improve the overall efficiency and stability of the quantum dot light emitting diode devices. For example, where the hole transport layer is formed by the inorganic material, the pores in the hole transport layer may be formed by a hydrothermal method, a high temperature calcination method, and so on, and impurities may be removed by a high-temperature treatment or the like, and therefore avoiding the material itself or the residual impurities therein to affect the light emitting efficiency and lifetime of the quantum dot light emitting diode device.

In the embodiment, the material of the hole transport layer may also comprise an organic material such as PVK, TFB, TPD or the like.

In the embodiment, a material of the first electrode and/or the second electrode may be, for example, a transparent conductive oxide or a conductive polymer, such as ITO, FTO, or the like. The material of the first electrode and/or the second electrode may also be an opaque metal, such as Al, Ag, or the like. The embodiment is not limited in this aspect.

In the embodiment, the material of the quantum dot light emitting layer may be any kind of quantum dot material, such as a silicon quantum dot material, a germanium quantum dot material, a cadmium sulfide quantum dot material, a cadmium selenide quantum dot material, a cadmium telluride quantum dot material, a zinc selenide quantum dot material, a lead sulfide quantum dot material, a lead selenide quantum dot material, an indium phosphide quantum dot material, an indium arsenide quantum dot material or the like, which is not limited in the embodiment.

Figure 3:
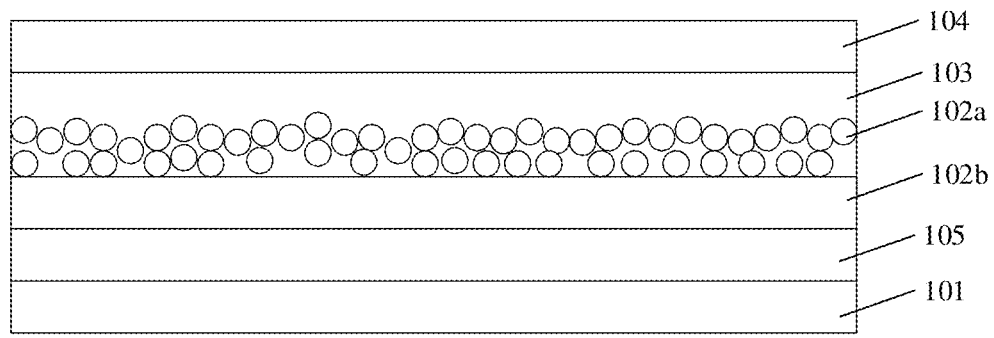
FIG. 3 is third schematic diagram of a quantum dot light emitting diode provided by an embodiment of the present disclosure.

For example, in the embodiment, the quantum dot light emitting diode may further comprise a hole injection layer. As illustrated in FIG. 3, the hole injection layer 105 is disposed on the first electrode 101, and the hole transport layer 102 is disposed on the hole injection layer 105. For example, the lower hole transport layer 102b may be disposed on the hole injection layer 105. In the embodiment, the hole injection layer can improve the injection efficiency of holes in the quantum dot light emitting layer.

For example, in the embodiment, a material of the hole injection layer may be an inorganic material, such as molybdenum oxide, vanadium oxide, tungsten oxide, nickel oxide or the like. The type of the inorganic material can be selected according to an actual situation, for example, the material of the quantum dot emitting layer, the material of the hole transport layer and so on, which is not limited in the embodiment.

In the embodiment, the hole injection layer formed by the inorganic material has a good water-proof capability and oxygen permeability resistance, and a crystal structure of the inorganic material is stable, and residual impurities may be removed by a high-temperature process, so the hole injection layer formed by the inorganic material can improve the overall efficiency and stability of the quantum dot light emitting diode devices.

In the embodiment, the material of the hole injection layer may also comprise an organic material such as PEDOT:PSS or the like.

Figure 4:
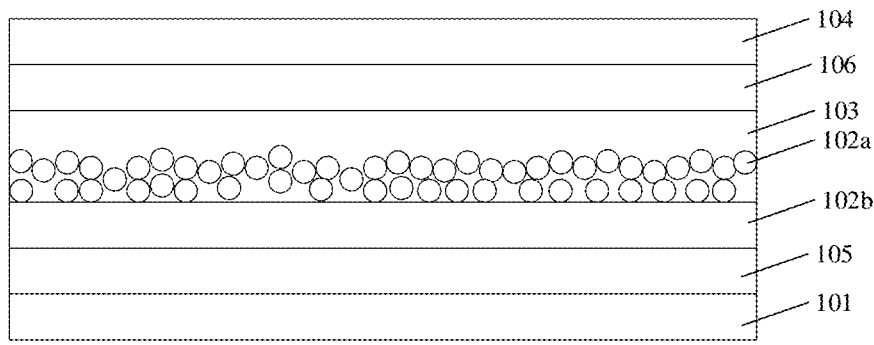
FIG. 4 is a fourth schematic diagram of a quantum dot light emitting diode provided by an embodiment of the present disclosure.

For example, in the embodiment, the quantum dot light emitting diode may further comprise an electron transport layer. As illustrated in FIG. 4, the electron transport layer 106 may be disposed, for example, between the second electrode 104 and the quantum dot light emitting layer 103. For example, a material of the electron transport layer may comprise zinc oxide, magnesium zinc oxide or any other material suitable for the electron transport layer, which is not limited in the embodiment.

For example, in the embodiment, the quantum dot light emitting diode may further comprise a metal oxide layer. For example, the metal oxide layer may be disposed between the electron transport layer 106 and the quantum dot light emitting layer 103; for example, the metal oxide layer may be disposed between the electron transport layer 106 and the second electrode 104; for example, the metal oxide layer may be disposed between the hole transport layer 102 and the quantum dot light emitting layer 103, and disposed in the pores of the hole transport layer 102. For example, the metal oxide layer may also be provided in two or three of the above positions at the same time. The metal oxide layer can block electrons and resist water and oxygen, and can also avoid the SPP conduction mode (i.e., photoelectrons and carriers in the device co-oscillate) of light inside the device, and therefore the light emitting efficiency of the quantum dot light emitting diode device can be increased.

For example, the metal oxide layer comprises a metal oxide film having a rough surface. For example, a material of the metal oxide layer comprises alumina, tin oxide, indium oxide or the like.

Figure 5:
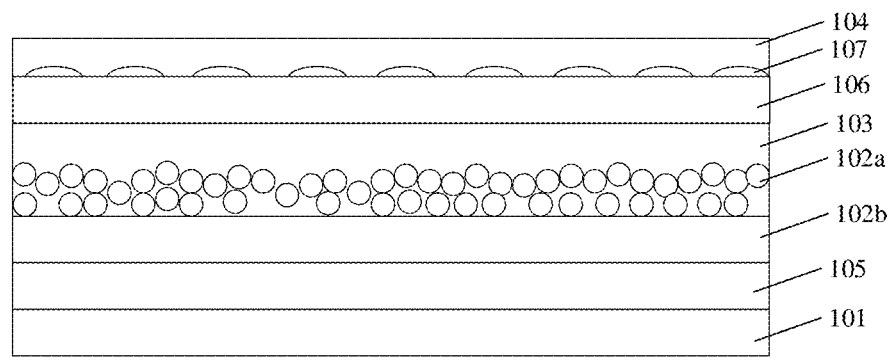
FIG. 5 is a fifth schematic diagram of a quantum dot light emitting diode provided by an embodiment of the present disclosure.

For example, as illustrated in FIG. 5, in this example, the metal oxide layer 107 is disposed between the electron transport layer 106 and the second electrode 104. For example, the metal oxide film having a rough surface in the metal oxide layer in this example is a metal oxide film distributed in an island shape. The metal oxide film having the rough surface can better avoid the SPP conduction mode of light inside the device, and therefore the light emitting efficiency of the quantum dot light emitting diode device can be increased.

For example, in one example, the metal oxide layer may also be disposed between the hole transport layer and the quantum dot light emitting layer, and disposed in the pores of the hole transport layer. In this situation, the metal oxide material may also fill defects that may exist on the surface of the quantum dot light emitting layer material, and therefore preventing excitons (for example, the excitons generated by the combination of holes and electrons) from being quenched at the defects, and increasing light emitting efficiency of the light emitting diode devices. For example, in this example, the metal oxide layer can increase the light emitting efficiency of the quantum dot light emitting diode device from 20% to more than 50%.

Figure 6:
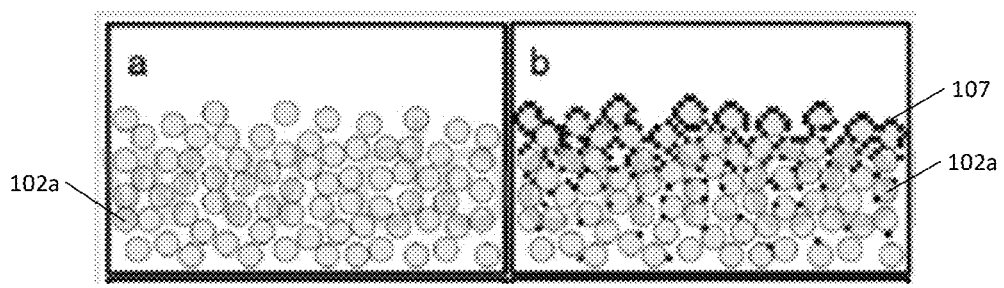
FIG. 6 is a schematic diagram of a hole transport layer having pores and a metal oxide material in the pores in a quantum dot light emitting diode provided by an embodiment of the present disclosure.

For example, where the metal oxide layer is disposed between the hole transport layer and the quantum dot light emitting layer, the metal oxide may form a thin layer on the hole transport layer having pores. For example, as illustrated in FIG. 6, "a" shows the hole transport layer having pores, and "b" shows a situation where the metal oxide layer is provided on the hole transport layer having pores. In the example, the material of the metal oxide material 107 comprises, for example, alumina nanoparticles, which may adhere to the pores but not fill the pores, so that a morphology of the pores in the hole transport layer is maintained after the metal oxide layer is formed, and the material of the quantum dot light emitting layer formed on the metal oxide layer may still fill the pores in the hole transport layer to increase the contact area of the hole transport layer and the quantum dot light emitting layer, and therefore the amount of holes injected into the quantum dot light emitting layer can be increased to allow the number of carriers (e.g., electrons and holes) in the quantum dot light emitting layer to be more balanced.

Figure 7:
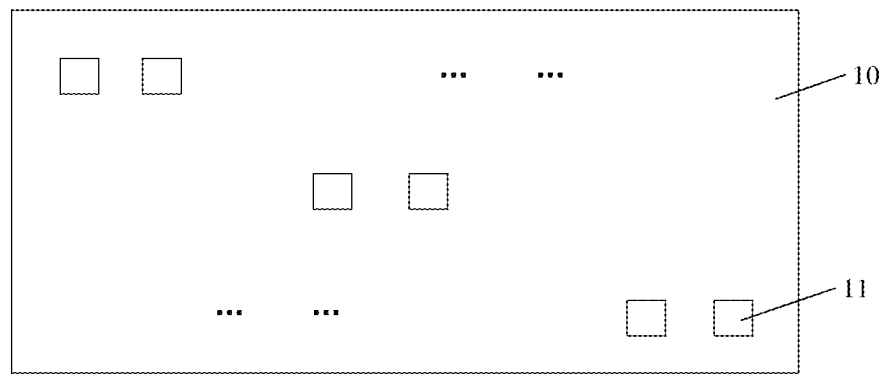
FIG. 7 is a schematic diagram of a display panel provided by an embodiment of the present disclosure.

At least one embodiment of the present disclosure provides a quantum dot light emitting display panel. As illustrated in FIG. 7, the display panel 10 comprises a plurality of pixel units 11. For example, each pixel unit 11 comprises the above quantum dot light emitting diode.

In the embodiment, the pixel unit of the display panel may further comprise functional components, such as a thin film transistor, a storage capacitor and so on, which is not limited in the embodiment.

Figure 8:
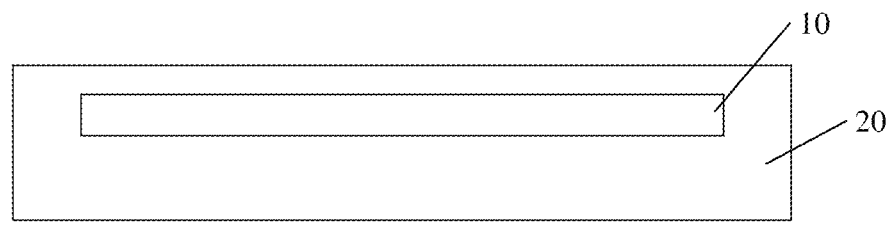
FIG. 8 is a schematic diagram of a display device provided by an embodiment of the present disclosure.

The embodiment further provides a display device. As illustrated in FIG. 8, the display device 20 comprises the above quantum dot light emitting display panel 10. The display device may be any product or component having a display function, such as a mobile phone, a tablet computer, a television, a display, a notebook computer, a digital photo frame, a navigator or the like, which is not limited in the embodiment.

Figure 9:
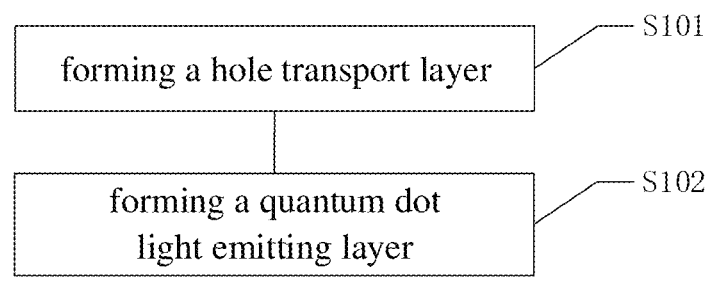
FIG. 9 is a first flow diagram of a manufacture method of a quantum dot light emitting diode provided by an embodiment of the present disclosure.

At least one embodiment of the present disclosure provides a manufacture method of a quantum dot light emitting diode. As illustrated in FIG. 9, the manufacture method comprises steps S101 to S102.

Step S101: forming a hole transport layer.

In the embodiment, the hole transport layer comprises a porous structure layer having pores.

Step S102: forming a quantum dot light emitting layer.

In the embodiment, the quantum dot light emitting layer is formed on the above formed hole transport layer, and the quantum dot light emitting layer is formed to contact the porous structure layer and a forming material of the quantum dot light emitting layer is formed in at least a part of the pores.

Figure 10:
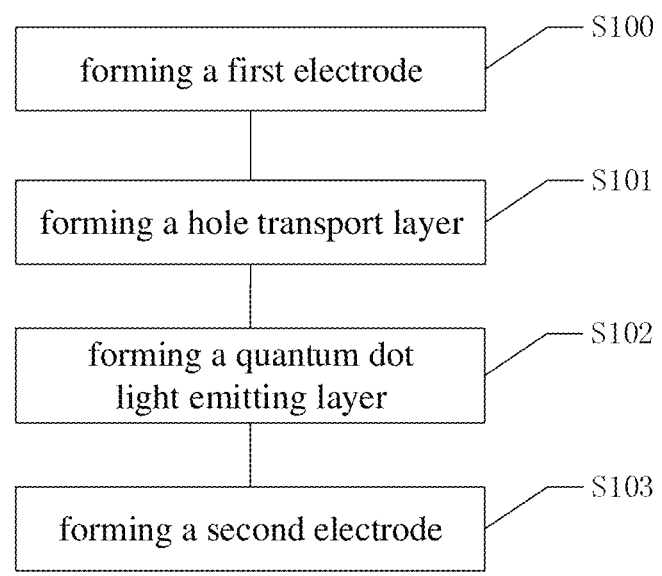
FIG. 10 is a second flow diagram of a manufacture method of a quantum dot light emitting diode provided by an embodiment of the present disclosure.

In another example of the embodiment, as illustrated in FIG. 10, the manufacture method of a quantum dot light emitting diode may comprise steps S100 to S103.

Step S100: forming a first electrode.

In the embodiment, the first electrode may be formed of a transparent conductive oxide, a conductive polymer or the like, such as ITO, FTO, etc.; in addition, the first electrode may also be formed of an opaque metal material, such as Al, Ag or the like.

For example, in combination with FIG. 2, a first electrode material layer may be formed on a substrate (not shown in the figure) by a magnetron sputtering method or an evaporation method, and then a patterning process, comprising exposing, developing, etching processes and so on, is performed to form a patterned first electrode 101. The material of the first electrode and the forming method of the first electrode are not specifically limited in the embodiment.

Step S101: forming a hole transport layer.

In the embodiment, for example, a hole transport layer comprising a porous structure layer having pores is formed on the above formed first electrode.

For example, the hole transport layer may be formed of an inorganic material, such as molybdenum oxide, vanadium oxide, tungsten oxide, nickel oxide, or the like. The type of the inorganic material may be selected according to an actual situation, for example, a material of a quantum dot emitting layer, and so on, which is not limited in the embodiment. In the embodiment, the material of the hole transport layer may also be an organic material, such as PVK, TFB, TPD or the like.

For example, in the embodiment, where the hole transport layer is formed of the inorganic material, the porous structure layer comprising pores may be formed by a hydrothermal method and a high temperature calcination method.

For example, forming the porous structure layer having pores may comprise: mixing a first material with a second material, and allowing a hydrothermal reaction of the first material and the second material to be performed, and then performing a film forming process to a reaction product to form a mixture film; and performing a high temperature calcination to the mixture film to remove the second material in the mixture film, and therefore the pores are formed at positions of the removed second material in the mixture film.

For example, in one example, forming the porous structure layer having the pores may comprise: first, mixing a material of the hole transport layer (a first material) with a carbon(C)-containing macromolecule material (a second material) in a certain volume ratio, and preparing a mixture solution. For example, the material of the hole transport layer is selected from materials such as $Ni(NO_3)_2$, $NiCl_2$, or the like, and the C-containing macromolecule material is selected from materials such as ethylenediaminetetraacetic acid (EDTA) or other suitable materials. For example, the volume ratio of the first material to the second material is about 1:(1-4), for example, the first material and the second material are mixed in a volume ratio of 1:2, 1:3 or the like to prepare a mixture solution, and then the mixture solution is stirred uniformly at room temperature. Then, the uniformly mixture solution is transferred to a high pressure reactor. For example, the temperature of the high pressure reactor is controlled at about 160° C., to allow the mixture solution to perform a hydrothermal reaction at the temperature, and the hydrothermal reaction can allow the first material and the second material to be tightly bonded by chemical bonds, such as coordination bonds, hydrogen bonds or the like, which is advantageous for forming a stable porous structure after the second material is removed by a subsequent process.

For example, after the hydrothermal reaction is completed, the reaction product may be washed, for example, by ethanol and deionized water respectively, to remove unnecessary loads such as the unreacted first material and/or the unreacted second material, and other impurities that may exist in the reaction product. The finally remained first material and the second material are bonded tightly as a whole. The washing process is advantageous for forming a uniform and stable porous structure after the second material is removed by the subsequent process. For example, the finally obtained reaction product is in a suspension state. Thereafter, the reaction product in the suspension state is used to form a film layer of a certain thickness on a position where the hole transport layer is to be formed, for example, on the first electrode by a spin coating method or the like, and then the film layer is placed in an oven to be dried. After drying, a high temperature heat treatment, for example, a high temperature calcination at a temperature of about 450° C. is performed, to remove the C-containing macromolecule materials in the film layer, and finally the porous structure layer having pores are formed on the first electrode.

In the example, pore sizes of the finally formed hole transport layer having pores may be controlled, for example, by adjusting the volume ratio of the material of the hole transport layer to the C-containing macromolecule material. For example, the smaller the volume ratio of the material of the hole transport layer to the C-containing macromolecule material is, that is, the more the content of the C-containing macromolecule material is, the larger the pore size of the hole transport layer having pores formed by the high temperature calcination is.

Figure 11:
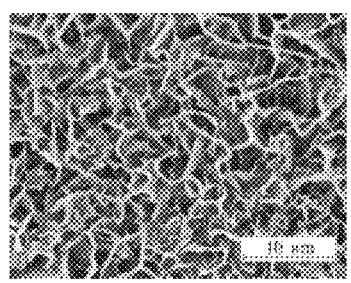
FIG. 11 is a scanning electron micrograph image of a hole transport layer having pores in a quantum dot light emitting diode provided by an embodiment of the present disclosure.

For example, in the example, the pores formed in the hole transport layer have sizes ranging from 2 nm to 100 nm, for example, the formed pores are mesopores having sizes ranging from 2 nm to 50 nm. For example, FIG. 11 illustrates a scanning electron micrograph image of the hole transport layer having pores. As illustrated in FIG. 11, the hole transport layer formed by the above method comprises uniformly distributed pores.

In the embodiment, the hole transport layer formed by the inorganic material has a good water-proof capability and oxygen permeability resistance, and a crystal structure of the inorganic material is stable, and the residual impurities may be removed by a high temperature process, so the hole transport layer formed by the inorganic material can improve the overall efficiency and stability of the quantum dot light emitting diode devices.

Step S102: forming a quantum dot light emitting layer.

In the embodiment, the quantum dot light emitting layer may be formed on the above formed hole transport layer, and the quantum dot light emitting layer is formed to contact the porous structure layer, and the material of the quantum dot light emitting layer is formed in at least a part of the pores.

In the embodiment, the material of the quantum dot light emitting layer may be any kind of quantum dot material, such as a silicon quantum dot material, a germanium quantum dot material, a cadmium sulfide quantum dot material, a cadmium selenide quantum dot material, a cadmium telluride quantum dot material, a zinc selenide quantum dot material, a lead sulfide quantum dot material, a lead selenide quantum dot material, an indium phosphide quantum dot material, an indium arsenide quantum dot material or the like, which is not limited in the embodiment.

In the embodiment, where the quantum dot light emitting layer is formed on the hole transport layer having pores, the material of the quantum dot light emitting layer may first fill into the pores of the hole transport layer, and then the dense quantum dot light emitting layer is formed. Therefore, the material of the quantum dot light emitting layer can sufficiently contacts the hole transport layer to increase the contact area of the hole transport layer and the quantum dot light emitting layer, and therefore the amount of holes injected into the quantum dot light emitting layer can be increased, to allow the number of carriers (such as electrons and holes) in the quantum dot light emitting layer to be more balanced.

Step S103: forming a second electrode.

In the embodiment, the second electrode may be formed of a transparent conductive oxide, a conductive polymer or the like, such as ITO, FTO, etc.; in addition, the second electrode may also be formed of an opaque metal material, such as Al, Ag or the like.

For example, the second electrode may be formed on the quantum dot light emitting layer by a magnetron sputtering method, an evaporation method or the like. The material of the second electrode and the forming method of the second electrode are not specifically limited in the embodiment.

In an example of the embodiment, forming the hole transport layer may comprise, for example, forming an upper hole transport layer and a lower hole transport layer, and the upper hole transport layer is the porous structure layer having pores.

For example, in the example, a dense hole transport layer may be first formed on the first electrode by a magnetron sputtering method, an evaporation method, an atomic layer deposition method or the like, and then the hole transport layer having pores is formed on the dense hole transport layer by the above hydrothermal method and high temperature calcination method.

For example, the manufacture method of a quantum dot light emitting diode provided in the embodiment may further comprise forming a hole injection layer. In this situation, for example, the hole injection layer may be first formed on the first electrode; then the hole transport layer is formed on the hole injection layer. For example, the hole injection layer may be formed of an inorganic material such as molybdenum oxide, vanadium oxide, tungsten oxide, nickel oxide or the like. The type of the inorganic material may be selected according to an actual situation, for example, the material of the quantum dot light emitting layer, the material of the hole transport layer, and so on, which is not limited in the embodiment.

For example, the manufacture method of a quantum dot light emitting diode provided in the embodiment may further comprise forming an electron transport layer. The electron transport layer may be formed, for example, between the second electrode and the quantum dot light emitting layer, that is, the electron transport layer is formed after the quantum dot light emitting layer is formed, and then the second electrode is formed on the electron transport layer. For example, a material of the electron transport layer may comprise zinc oxide, magnesium zinc oxide or any other material suitable for the electron transport layer, which is not limited in the embodiment.

For example, the manufacture method of a quantum dot light emitting diode provided in the embodiment may further comprise forming a metal oxide layer. For example, the metal oxide layer may be formed between the electron transport layer and the quantum dot light emitting layer. For example, the metal oxide layer may be formed between the electron transport layer and the second electrode. For example, the metal oxide layer may also be formed between the hole transport layer and the quantum dot light emitting layer and formed in the pores of the hole transport layer. For example, the metal oxide layer may be simultaneously formed in two or three of the above positions. The metal oxide layer can block electrons and resist water and oxygen, and can also avoid the SPP conduction mode (i.e., photoelectrons and carriers in the device co-oscillate) of light inside the device, and therefore the light emitting efficiency of the quantum dot light emitting diode device can be increased.

For example, the metal oxide layer may be formed of an oxide material, such as aluminum oxide, tin oxide, indium oxide or the like.

For example, the metal oxide layer may comprise a metal oxide film having a rough surface. For example, forming the metal oxide film having the rough surface may comprise: forming a metal film having a rough surface by an evaporation method or a magnetron sputtering method, and then oxidizing the metal film; alternatively, directly forming the metal oxide film having the rough surface under an oxygen atmosphere by the evaporation method or the magnetron sputtering method.

For example, in a example, forming the metal oxide layer by an alumina material is taken as an example, forming the metal oxide layer may comprise: first, the evaporation method, the magnetron sputtering method, or the like may be performed to rapidly deposit a thin layer of metal aluminum (Al) material at a position where the metal oxide layer is to be formed. For example, a speed of the rapid deposition is about 5 Å-10 Å (Em) per second, and an island-shaped distributed aluminum film having a thickness of, for example, about 20 Å-50 Å, such as 30 Å, 40 Å, 50 Å, or the like, may be formed. The aluminum film is oxidized by oxygen to form an island-shaped distributed aluminum oxide (AlOx) film. Alternatively, in another example, a certain proportion of oxygen may be directly introduced during the evaporation process, the magnetron sputtering process of the aluminum metal to directly and rapidly deposit a thin layer of aluminum oxide at the position where the metal oxide layer is to be formed, for example, the speed of the rapid deposition is about 5 Å-10 Å (Em) per second, and therefore an island-shaped distributed aluminum oxide (AlOx) film having a thickness of 20 Å-50 Å, such as 30 Å, 40 Å, 50 Å or the like, is directly formed. The metal oxide layer having the rough surface can better avoid the SPP conduction mode of light inside the quantum dot light emitting diode device and increase the light emitting efficiency of the quantum dot light emitting diode device.

The following statements should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness of a layer or a structure may be enlarged or reduced. However, it should understood that, in the case in which a component or element such as a layer, film, area, substrate or the like is referred to be "on" or "under" another component or element, it may be directly on or under the another component or element or a component or element is interposed therebetween.

(3) In case of no conflict, features in one embodiment or in different embodiments can be combined to obtain new embodiments.

The above descriptions are only specific embodiments of the present disclosure, but the protection scope of the present disclosure is not limited thereto, those skilled in the art may make some improvements and modifications within the technical scope of the present disclosure, and the improvements and modifications should be within the protection scope of the present disclosure. Therefore, the protection scope of the present disclosure should be determined by the protection scope of the claims.

What is claimed is:

1. A quantum dot light emitting diode, comprising:
a hole transport layer, comprising a porous structure layer having pores;
a quantum dot light emitting layer, disposed on the hole transport layer;
wherein the quantum dot light emitting layer contacts the porous structure layer, and a material of the quantum dot light emitting layer is disposed in at least a part of the pores,
wherein an interface between the quantum dot light emitting layer and the hole transport layer is a rough interface, and at least a portion of the material of the quantum dot light emitting layer is disposed within the hole transport layer,
wherein the quantum dot light emitting diode further comprises:
a second electrode, disposed on the quantum dot light emitting layer;
an electron transport layer, disposed between the second electrode and the quantum dot light emitting layer;
a metal oxide layer, disposed between the electron transport layer and the quantum dot light emitting layer, and between the electron transport layer and the second electrode, and between the hole transport layer and the quantum dot light emitting layer and a material of the metal oxide layer disposed in at least a part of the pores of the hole transport layer,
wherein the metal oxide layer comprises a metal oxide film having a rough surface,
the material of the metal oxide layer comprises alumina, the metal oxide layer comprises the alumina film, the alumina film has a thickness of 20 Å-50 Å.

2. The quantum dot light emitting diode according to claim 1, wherein the hole transport layer comprises an upper hole transport layer and a lower hole transport layer;

the upper hole transport layer comprises the porous structure layer having pores; and
the lower layer hole transport layer comprises a dense layer.

3. The quantum dot light emitting diode according to claim 1, further comprising:
a first electrode; and
a hole injection layer, disposed on the first electrode, wherein the hole transport layer is disposed on the hole injection layer.

4. The quantum dot light emitting diode according to claim 3, wherein a material of the hole transport layer and/or a material of the hole injection layer comprises an inorganic material.

5. The quantum dot light emitting diode according to claim 4, wherein the inorganic material comprises molybdenum oxide, vanadium oxide, tungsten oxide or nickel oxide.

6. The quantum dot light emitting diode according to claim 2, further comprising:
a first electrode;
a hole injection layer, disposed on the first electrode, wherein the hole transport layer is disposed on the hole injection layer; and
a second electrode, disposed on the quantum dot light emitting layer.

7. A display panel, comprising the quantum dot light emitting diode according to claim 1.

8. A manufacture method of a quantum dot light emitting diode, comprising:
forming a hole transport layer, wherein the hole transport layer comprises a porous structure layer having pores; and
forming a quantum dot light emitting layer on the hole transport layer, wherein the quantum dot light emitting layer is formed to contact the porous structure layer, and a material of the quantum dot light emitting layer is formed in at least a part of the pores,
wherein an interface between the quantum dot light emitting layer and the hole transport layer is a rough interface, and at least a portion of the material of the quantum dot light emitting layer is disposed within the hole transport layer,
wherein the quantum dot light emitting diode further comprises:
a second electrode, disposed on the quantum dot light emitting layer;
an electron transport layer, disposed between the second electrode and the quantum dot light emitting layer;
wherein the manufacture method further comprises forming a metal oxide layer between the electron transport layer and the quantum dot light emitting layer, between the electron transport layer and the second electrode, and between the hole transport layer and the quantum dot light emitting layer,
wherein the metal oxide layer comprises a metal oxide film having a rough surface; and forming the metal oxide film having the rough surface comprises:
forming a metal film having a rough surface by an evaporation method or a magnetron sputtering method, and then oxidizing the metal film; or
directly forming the metal oxide film having the rough surface under an oxygen atmosphere by the evaporation method or the magnetron sputtering method,
wherein a material of the metal oxide layer disposed in at least a part of the pores of the hole transport layer, the material of the metal oxide layer comprises alumina, the metal oxide film comprises the alumina film, the alumina film has a thickness of 20 Å-50 Å.

9. The manufacture method of a quantum dot light emitting diode according to claim 8, wherein forming the hole transport layer comprises forming an upper hole transport layer and a lower hole transport layer;

the upper hole transport layer comprises the porous structure layer having pores; and the lower layer hole transport layer comprise a dense layer.

10. The manufacture method of a quantum dot light emitting diode according to claim 8, wherein forming the porous structure layer comprises:

mixing a first material with a second material, and performing a hydrothermal reaction of the first material and the second material, and then performing a film forming process to a reaction product obtained by the hydrothermal reaction to form a mixture film;

performing a high temperature calcination to the mixture film, to remove the second material in the mixture film.

11. The manufacture method of a quantum dot light emitting diode according to claim 10, wherein after the hydrothermal reaction is completed, the reaction product is washed to remove the first material which is unreacted and/or the second material which is unreacted, and then the film forming process is performed to the reaction product.

12. The manufacture method of a quantum dot light emitting diode according to claim 10, wherein a volume ratio of the first material to the second material is 1:(1-4).

13. The manufacture method of the quantum dot light emitting diode according to claim 9, wherein forming the porous structure layer comprises:

mixing a first material with a second material, and performing a hydrothermal reaction of the first material and the second material, and then performing a film forming process to a reaction product obtained by the hydrothermal reaction to form a mixture film;

performing a high temperature calcination to the mixture film, to remove the second material in the mixture film.

14. The manufacture method of the quantum dot light emitting diode according to claim 11, wherein a volume ratio of the first material to the second material is 1:(1-4).

* * * * *